(12) United States Patent
Oliveira et al.

(10) Patent No.: US 9,858,372 B1
(45) Date of Patent: Jan. 2, 2018

(54) METHODS, SYSTEMS, AND COMPUTER PROGRAM PRODUCT FOR VERIFYING AN ELECTRONIC DESIGN

(71) Applicant: Cadence Design Systems, Inc., San Jose, CA (US)

(72) Inventors: Hudson Dyele Oliveira, Belo Horizonte (BR); Abner Luis Panho Marciano, Belo Horizonte (BR); Guilherme Seminotti Braga, Belo Horizonte (BR); Caio Texeira Campos, Austin, TX (US); Breno Rodrigues Guimares, Belo Horizonte (BR); Rodrigo Fonseca Rocha Soares, Belo Horizonte (BR); Laiz Lipiainen Santos, Belo Horizonte (BR); Raquel Lara dos Santos Pereira, Belo Horizonte (BR); Adriana Cassia Rossi de Almeida Braz, Brasilia (BR)

(73) Assignee: Cadence Design Systems, Inc., San Jose, CA (US)

( * ) Notice: Subject to any disclaimer, the term of this patent is extended or adjusted under 35 U.S.C. 154(b) by 25 days.

(21) Appl. No.: 15/169,660

(22) Filed: May 31, 2016

(51) Int. Cl.
    *G06F 17/50* (2006.01)
(52) U.S. Cl.
    CPC ........ *G06F 17/504* (2013.01); *G06F 17/5045* (2013.01)

(58) Field of Classification Search
    CPC .................................................. G06F 17/504
    USPC ........................................................ 716/106
    See application file for complete search history.

(56) References Cited

U.S. PATENT DOCUMENTS

| 9,665,682 B1 | 5/2017 | Guimaraes et al. |
| 2004/0230407 A1* | 11/2004 | Gupta ................... G06F 17/504 703/2 |
| 2005/0289486 A1* | 12/2005 | Caron ................... G06F 17/504 716/107 |
| 2016/0283628 A1 | 9/2016 | Peixoto et al. |

* cited by examiner

*Primary Examiner* — Suresh Memula
(74) *Attorney, Agent, or Firm* — Vista IP Law Group, LLP

(57) ABSTRACT

Disclosed are techniques for implementing formal verification of an electronic design. These techniques identify a target property for verification in a hierarchical electronic design that has a plurality of hierarchies and perform hierarchical synthesis on a hierarchy or a portion thereof in the plurality of hierarchies while black-boxing a remaining portion of the hierarchical electronic design. Cone of influence (COI) data that is relevant to the target property may be determined at least by extracting the cone of influence data from a hierarchically synthesized hierarchy or portion of the hierarchy or the portion thereof. At least the cone of influence data may be forwarded to a formal engine that uses the cone of influence data to verify the target property.

22 Claims, 13 Drawing Sheets

METHODS, SYSTEMS, AND COMPUTER PROGRAM PRODUCT FOR VERIFYING AN ELECTRONIC DESIGN

BACKGROUND

Modern electronic design automation (EDA) tools are devised to communicate design intent and the circuit behavior between a circuit designer and other technical personnel such as design team member. With the number of transistors in an integrated circuit (IC) doubling approximately every two years according to the Moore's law, contemporary electronic designs have become increasingly bigger and more complex over time. Moreover, integration of increasingly complex circuit components into a complex circuit design has become a steadily growing trend and oftentimes imposes limits on the size of the problem and thus on the capacity of the electronic design elaboration or synthesis and of verification engines.

Conventional approaches cope with this problem by utilizing more powerful computing systems with more computing resources (e.g., more memory, higher clock speed, higher upper bound speed in Floating Point Operations per second, etc.) that elaborate an electronic design in its entirety and maintain a model of the electronic design in memory for formal verification tasks. Nonetheless, these approaches merely use higher capacity computing systems that have a higher limit on the size of problems that these higher capacity computing systems may handle and do not actually address the challenges imposed by increasingly more complex electronic designs.

Therefore, there exists a need for a method, system, and computer program product for implementing formal verification of an electronic design to solve the challenges posed by modern electronic designs.

SUMMARY

Disclosed are method(s), system(s), and article(s) of manufacture for implementing formal verification of an electronic design in various embodiments. Some first embodiments are directed at a method for implementing formal verification of an electronic design. In these embodiments, a target property may be identified for verification in a hierarchical electronic design that has a plurality of hierarchies; and hierarchical synthesis may be performed on a hierarchy or a portion thereof in the plurality of hierarchies while black-boxing a remaining portion of the hierarchical electronic design. Cone of influence (COI) data that is relevant to the target property may be determined at least by extracting the cone of influence data from a hierarchically synthesized hierarchy or portion of the hierarchy or the portion thereof. At least the cone of influence data may be forwarded to one or more formal engines that use the cone of influence data to verify the target property.

In some embodiments, a COI sub-file may be generated to store the cone of influence data; and one or more COI sub-files may be aggregated into a partially or completely aggregated single COI file. The partially or completely aggregated single COI file may be forwarded to one or more formal engines that use the partially or completely aggregated single COI file to verify the target property; and formal verification tasks may be performed for the target property using the partially or completely aggregated single COI file.

In addition or in the alternative, one or more circuit component designs in the hierarchy or the portion thereof may be identified; one or more hierarchies that are situated below the hierarchy or the portion in the hierarchical electronic design may be identified; and the contents of the one or more hierarchies may be black-boxed so that the contents of the one or more hierarchies are not synthesized or not elaborated in the hierarchical synthesis of the hierarchy or the portion thereof.

In some of these immediately preceding embodiments, the hierarchy synthesis may be performed on the hierarchy or the portion thereof and on the one or more hierarchies below the hierarchy at a plurality of computing nodes in a parallel or distributed computing paradigm; the COI data relevant to the target property may be extracted from the hierarchically synthesized hierarchy or portion of the hierarchy or the portion thereof and from one or more corresponding hierarchically synthesized portions of the one or more hierarchies; and a plurality of COI sub-files respectively storing the COI data may be generated anew or identified from an existing COI sub-file store for the hierarchically synthesized hierarchy or portion and the one or more corresponding hierarchically synthesized portions. In addition or in the alternative, two or more of the plurality of COI sub-files may be aggregated into a partially or completely aggregated COI file.

In some embodiments, it may be determined whether the formal engine verifies the target property with the cone of influence data from the hierarchically synthesized hierarchy or portion. When it is determined that the formal engine verifies the target property with only the cone of influence data from the hierarchically synthesized hierarchy or portion, a next target property may be identified for verification by the one or more formal engines working on the target property.

When it is determined that the formal engine is not able to verify the target property with only the cone of influence data from the hierarchically synthesized hierarchy or portion, the COI data relevant to the target property may be extracted anew or identified from an existing data store from one or more additional hierarchically synthesized portions of the hierarchical electronic design. One or more additional COI sub-files respectively storing the COI data may be generated anew or identified from an existing COI sub-file store for the one or more additional hierarchically synthesized portions. In some of these immediately preceding embodiments, the COI data in the one or more additional COI sub-files may be forwarded to the formal engine; and formal verification tasks may be performed for the target property using the COI data in the one or more additional COI sub-files.

Some embodiments are directed at a hardware module or system that may be invoked to perform any of the methods, processes, or sub-processes disclosed herein. The hardware system may include one or more hardware modules that by themselves or in conjunction with one or more other hardware components, one or more software modules, or a combination of one or more hardware components and one or more software modules of one or more computing systems to execute a sequence of instruction to perform various acts such as the performance of identification, determination, hierarchical synthesis, data forwarding, data aggregation, data generation, formal verification tasks, black-boxing, etc. Some illustrative modules or components of the hardware system may be found in the System Architecture Overview section below.

Some embodiments are directed at an article of manufacture that includes a non-transitory machine-accessible storage medium having stored thereupon a sequence of instructions which, when executed by at least one micro-processor or at least one processor core, causes the at least one micro-processor or the at least one processor core to perform any of the methods, processes, or sub-processes disclosed herein. Some illustrative forms of the non-transitory machine-readable storage media may also be found in the System Architecture Overview section below.

More details of various aspects of the methods, systems, or articles of manufacture for verifying an electronic design are described below with reference to FIGS. 1-6.

BRIEF DESCRIPTION OF THE DRAWINGS

The drawings illustrate the design and utility of various embodiments of the invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
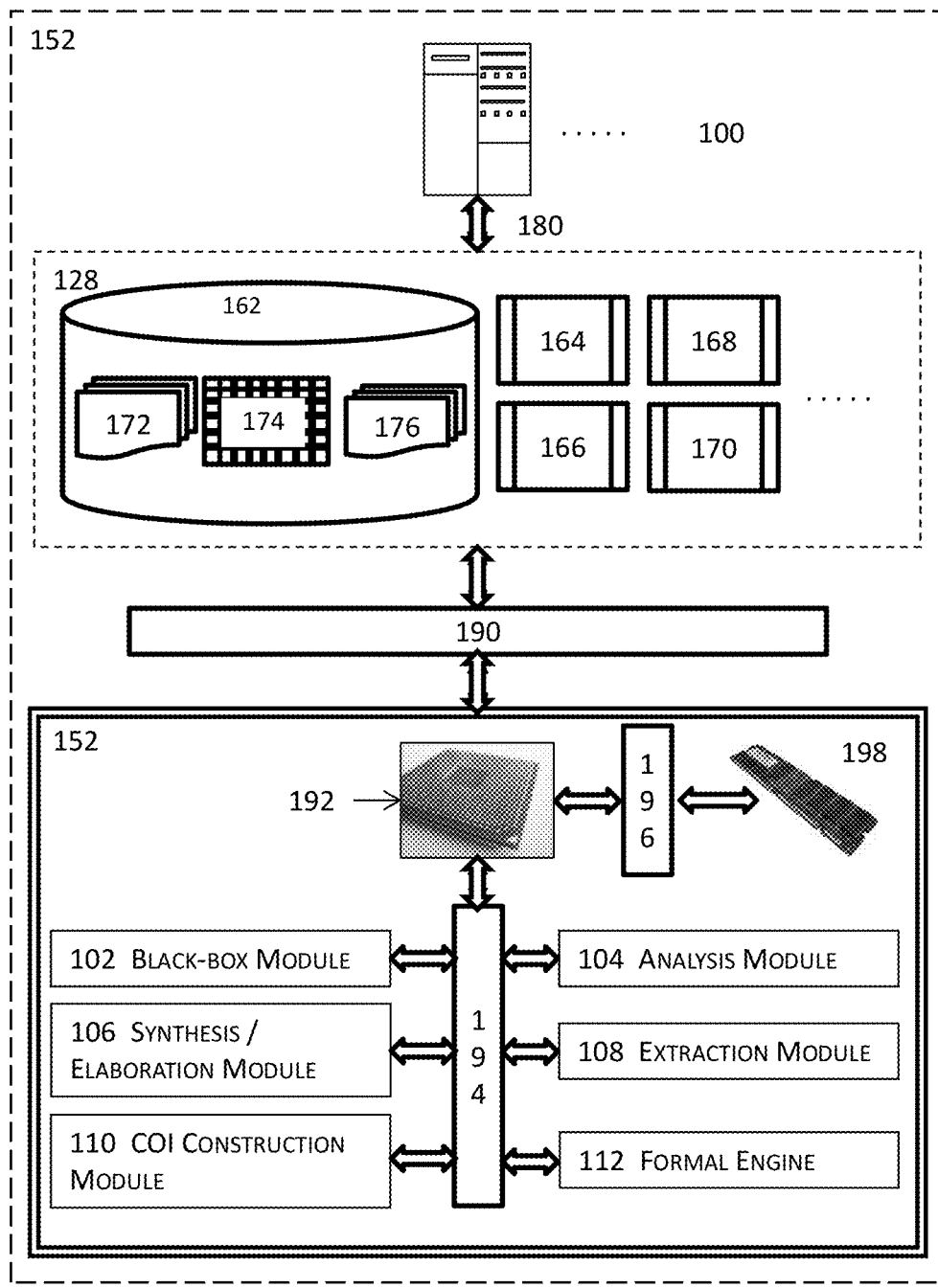
FIG. 1 illustrates a high level schematic block diagram verifying an electronic design in one or more embodiments.

Various embodiments are directed to a method, system, and computer program product for implementing formal verification of an electronic design. Other objects, features, and advantages of the invention are described in the detailed description, figures, and claims.

In some embodiments, an electronic design comprising a plurality of hierarchies may be separately, hierarchically synthesized or elaborated, without loading, elaborating, or synthesizing the electronic design in its entirety and without maintaining the entire synthesized or elaborated electronic design in memory. For example, a hierarchy including one or more instances at one or more lower hierarchies of an electronic design may be synthesized or elaborated while black-boxing these one or more instances at one or more lower hierarchies. That is, these one or more instances at one or more lower hierarchies will not be synthesized during the elaboration or synthesis of the hierarchy. It shall be noted that although some embodiments may perform various functions described herein to achieve intended purposes without loading, elaborating, or synthesizing an electronic design of interest in its interest, some other embodiments may not be so restrictive and thus may allow loading, elaborating, or synthesizing an electronic design in its entirety, especially when the size or complexity of the electronic design does not impose prohibitively high computational cost or runtime, or when the situations arise to require loading, elaborating, or synthesizing an electronic design in its entirety.

One or more COI (cone of influence) files may be generated for a target property to be verified from the elaborated hierarchy of the electronic design. These one or more instances at one or more lower hierarchies may be separately, hierarchically synthesized or elaborated in an identical or substantially similar manner where additional lower hierarchies are black-boxed and not synthesized or elaborated during the synthesis or elaboration of an instance at a lower hierarchy. The corresponding COI sub-files may similarly be generated for each of these one or more instances at one or more lower hierarchies. The hierarchical synthesis or elaboration of the entire electronic may thus be partitioned hierarchically and performed separately in a parallel paradigm or a distributed computing environment to generate respective COI sub-files. There COI sub-files may be stored in a persistent storage device or non-persistent storage blocks (e.g., random access memory of one or more computing systems). Once these COI sub-files are generated, the elaborated design partitions may be deallocated from the system memory to reduce the memory footprint of the problem presented to the formal engine.

The target property may thus be verified by forwarding at least one of these COI sub-files to the formal engine. In some embodiments, these COI sub-files may be incrementally merged and forwarded to the formal engine that verifies the target property. In these embodiments, the formal verification of a target property may be performed incrementally by forwarding, for example, a first COI sub-file (e.g., the COI sub-file generated from the partition closest to the target property of the electronic design) including the target property to the formal engine that attempts to verify the target property.

If the target property is verified then the process may proceed to another target property included in a COI sub-file. On the other hand, if a counter example is found for the target property, another COI sub-file (e.g., the COI sub-file generated from the partition that is directly connected to the partition generating the first COI sub-file that includes the target property) may be merged with the first COI sub-file for the formal engine. The formal engine may further attempt to verify the target property with this additional COI sub-file. The same process may continue with one or more additional COI sub-files until the target property is verified. In some other embodiments, all COI sub-files generated from the hierarchical synthesis may be merged all at once and forwarded to the formal engine to verify the target property.

FIG. 1 illustrates a high level schematic block diagrams for implementing formal verification of an electronic design in one or more embodiments. More specifically, FIG. 1 illustrates an illustrative high level schematic block diagrams for implementing formal verification of an electronic design and may comprise one or more computing systems 100, such as a general purpose computer described in the System Architecture Overview section to implement one or more special proposes.

In some embodiments, the one or more computing systems 100 may invoke various system resources such as the processor(s) or processor core(s), memory, disks, etc. The one or more computing systems 100 may also initiate or interact with other computing systems to access, via a computer bus architecture (e.g., a system bus, a control bus, a data bus, or any combinations thereof), various resources 128 that may comprise a floorplanner, a global routing engine, and/or a detail routing engine 164, a layout editor 166, a design rule checker 168, a verification engine 170, etc. The verification engine 170 may perform formal verification tasks in some embodiments.

The one or more computing systems 100 may further write to and read from a local or remote non-transitory computer accessible storage 162 that stores thereupon data or information such as, but not limited to, one or more databases (174) such as schematic design database(s) or physical design database(s), electronic circuit design specification database(s), various statistics, various data, rule decks, various design rules, constraints, etc. (172), or other information or data (176) that may be used to facilitate the performance of various functions to achieve the intended purposes.

In some embodiments, the one or more computing systems 100 may include or, either directly or indirectly through the various resources 128, invoke a set of modules 152 including hardware modules and software modules or combinations of one or more hardware modules and one or more software modules. Each of these modules may include or function in tandem with electrical circuitry and one or more micro-processors each having one or more processor cores to perform its intended functions.

The hardware system may further include one or more forms of non-transitory machine-readable storage media or persistent storage devices to temporarily or persistently store various types of data or information, various design rules, various libraries, selected and selectable targets, or any other suitable information or data, etc. A module is invoked and initialized in a computing system via, for example, an inter-process function communication (IPC) so that the software portion of the module is loaded and stored in memory (e.g., random access memory) to be executed by one or more processors or processor cores of the computing system to perform at least a part of the functionality of the module. Some illustrative modules or components of the hardware system may be found in the System Architecture Overview section below.

The set of modules 152 may comprise a black-box module 102 to black-box a portion of an electronic design. In some embodiments, the black-box module 102 may black-box all the instances at one or more lower hierarchies that are situated below a particular hierarchy of an electronic design so that these instances are ignored and hence not elaborated or synthesized when the particular hierarchy is synthesized. The set of modules 152 may also include one or more analysis modules 104 to perform one or more structural analyses, functional analyses, or any combinations thereof that may be further referenced by, for example, the extraction module 108, the synthesis or exploration modules 106, the COI construction module 110, etc. to perform their respective intended functions.

The set of modules 152 may further optionally include a synthesis or elaboration module 106 to process (e.g., to load, elaborate, or synthesize) a gate level design or a design description or behavior (e.g., a design description or behavior at register transfer level or RTL) into a design implementation in the form of logic gates by transforming an abstract form of circuit behaviors in a specific format (e.g., in a RTO or register transfer level) into a design implementation in terms of logic gates.

In addition or in the alternative, the set of modules 152 may include a extract module 108 to extract desired or required data or information from an electronic design or a portion thereof. The extraction module 108 may further function in conjunction with one or more modules (e.g., the black-box module 102, the analysis module 104, the synthesis or elaboration module 106, the COI construction module 110, the formal engine 112, etc.) to extract data or information from an electronic design or a portion thereof and transmit the extracted data or information to one or more other modules.

The set of modules 152 may include a COI construction module 110 that functions in tandem with, for example, the synthesis or elaboration module 106, the extraction module 108, etc. to construct a partial or a complete cone of influence for a target property. A cone of influence of a target property includes one or more signals (e.g., one or more signals in the fan-in cone of the target property) and circuit components (e.g., one or more nets or net segments, devices and circuit components along the one or more nets or net segments, etc.) pertaining to these one or more signals that may affect the property in some embodiments. In some embodiments, a COI construction module 110 may construct a cone of influence by iteratively aggregating COI data that are respectively extracted from the hierarchical, non-black-boxed portions of an electronic design or a portion thereof for the target property. The COI data may be aggregated into a verification input file that may be further provided to a formal engine 112 that performs various verification tasks to verify the target property or to generate one or more counter examples.

In some embodiments, the computing system 100 may include the various resources 128 such that these various resources may be invoked from within the computing system via a computer bus 180 (e.g., a data bus interfacing a microprocessor 192 and the non-transitory computer accessible storage medium 198 or a system bus 190 between a microprocessor 192 and one or more engines in the various resources 128). In some other embodiments, some or all of these various resources may be located remotely from the computing system 100 such that the computing system may access the some or all of these resources via a computer bus 180 and one or more network components.

The set of modules 152 may further optionally include one or more signoff modules (not shown) to perform various signoff and design closure tasks. For example, the one or more signoff modules may include one or more timing signoff modules to perform timing analyses and timing closure related tasks (e.g., silicon-accurate timing signoff, signal integrity analyses, etc.) to ensure an electronic design meets power, performance, or other requirements before tapeout, one or more signoff parasitic extraction modules to provide silicon-accurate interconnect parasitic extraction and ensure first-pass silicon success, and one or more power signoff modules to perform various power integrity analyses, transistor-level electro-migration and IR-drop analyses, or other power and signal integrity analyses with SPICE-level or better accuracy to ensure an electronic design meets or exceeds power, performance, and/or area goals in some embodiments.

The computing system may also include one or more modules in the set of modules 152. One or more modules in the set 152 may include or at least function in tandem with a microprocessor 192 via a computer bus 194 in some embodiments. In these embodiments, a single microprocessor 192 may be included in and thus shared among more than one module even when the computing system 100 includes only one microprocessor 192. A microprocessor 192 may further access some non-transitory memory 198 (e.g., random access memory or RAM) via a system bus 196 to read and/or write data during the microprocessor's execution of processes.

Figure 2:
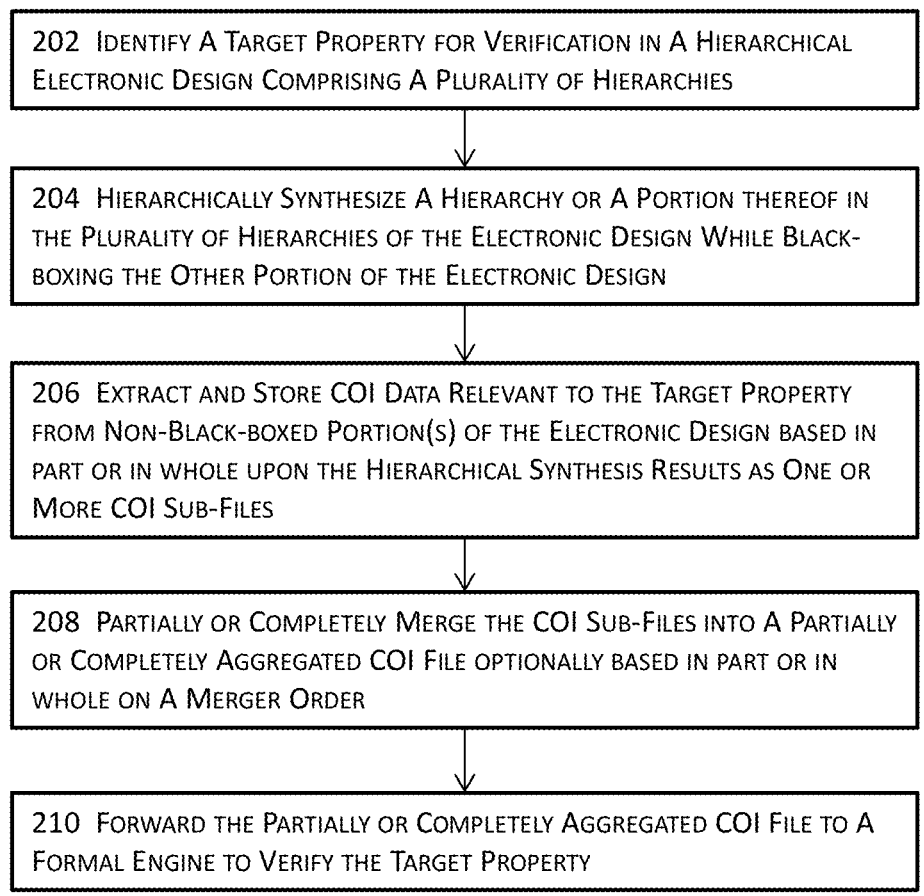
FIG. 2 illustrates a high block diagram for implementing formal verification of an electronic design in one or more embodiments.

FIG. 2 illustrates a high block diagram for implementing formal verification of an electronic design in one or more embodiments. In these one or more embodiments, a target property for verification may be identified at 202 in a hierarchical electronic design or a portion thereof that comprises a plurality of hierarchies. A target property may include the value of a signal at a node at a specific clock cycle or in response to a particular event in the elaborated first hierarchy in some embodiments. In the example illustrated in FIG. 4A, the electronic design or the portion 400A may include a first hierarchy 402A that further includes a plurality of instances 404A, 406A, 408A, 410A, 412A, and 414A. The first hierarchy 402A may further include one or more other discrete components and a plurality of nets or net segments (not shown) to interconnect the plurality of instances and the one or more other discrete components. An instance (e.g., any instance of 404A, 406A, 408A, 410A, 412A, and 414A) may include its own discrete components or one or more sub-instances at a second hierarchy that is one hierarchical level below the first hierarchy 402A.

A hierarchy or a portion thereof in the plurality of hierarchies may be hierarchically synthesized at 204 while black-boxing the other portion of the electronic design. In the example illustrated in FIG. 4A, for example, the electronic design 400A at the first hierarchy 402A may be hierarchically synthesized while the instances (e.g., all the instances such as 404A, 406A, 408A, 410A, 412A, and 414A situated at one or more hierarchies below the first hierarchy) are black-boxed and thus not synthesized or elaborated in the synthesis or elaboration of the first hierarchy 402A in some embodiments. Each of these instances may be separately, hierarchically synthesized in some other embodiments either sequentially by a single computing system or concurrently by a plurality of computing nodes in a parallel computing paradigm or a distributed computing paradigm. For example, instance 402A may be elaborated or synthesized with all the child instances black-boxed at a first computing node while instance 404A and instance 414A are respectively elaborated or synthesized at a second computing node and a third computing node with all their respective child instances black-boxed. In this manner, the load of synthesizing the electronic design or the portion thereof identified at 202 may be distributed among a plurality of computing nodes to alleviate the requirements of computing resources when compared to synthesizing the electronic design at a single computing node. For example, each of the plurality of computing nodes no longer needs a large amount of memory or power processors to accommodate the larger memory footprint when the electronic design is elaborated or synthesized at a single computing node.

Cone of influence (COI) data that are relevant to or may affect the target property may be extracted at 206 from one or more elaborated or synthesized non-black-boxed portion in an instance or at a hierarchy of the electronic design or the portion identified at 202 to create a COI sub-file for the instance or the hierarchy. In the aforementioned example illustrated in FIG. 4A where the first hierarchy 402A, the instance 404A, and the instance 414A are hierarchically extracted (with their respective child instances black-boxed), a first COI sub-file may be created for the first hierarchy 402A; a second COI sub-file may be created for instance 404A; and a third COI sub-file may be created for instance 406A. In some embodiments, a COI sub-file may be generated from the COI data extracted from the corresponding hierarchy or instance for each of the plurality of hierarchies or instances in the electronic design or the portion identified at 202. A COI sub-file may include, for example, information or data about the netlist, one or more target properties for verification, one or more assumptions that may be used in verifying those one or more target properties, the clock signals pertaining to those one or more target properties, one or more initial values of one or more signals pertaining to the verification of a target property, or any combinations thereof in some embodiments.

These COI sub-files created at 206 may be partially or completely aggregated or merged at 208 to create a partially or completely aggregated COI file for the target property. In some embodiments, various COI sub-files may be aggregated or merged based optionally in part or in whole upon a merger order. More details about aggregating COI sub-files and the merger order will be described below with reference to FIGS. 3A-B, 4A-D, and 5A-D. The partially or completely aggregated COI file generated at 208 may be forwarded at 210 to a formal engine which may then take this partially or completely aggregated COI file to verify the target property. More details about verifying a target property with a partially or completely aggregated COI file will be described below with reference to FIGS. 5A-D.

Figure 3A:
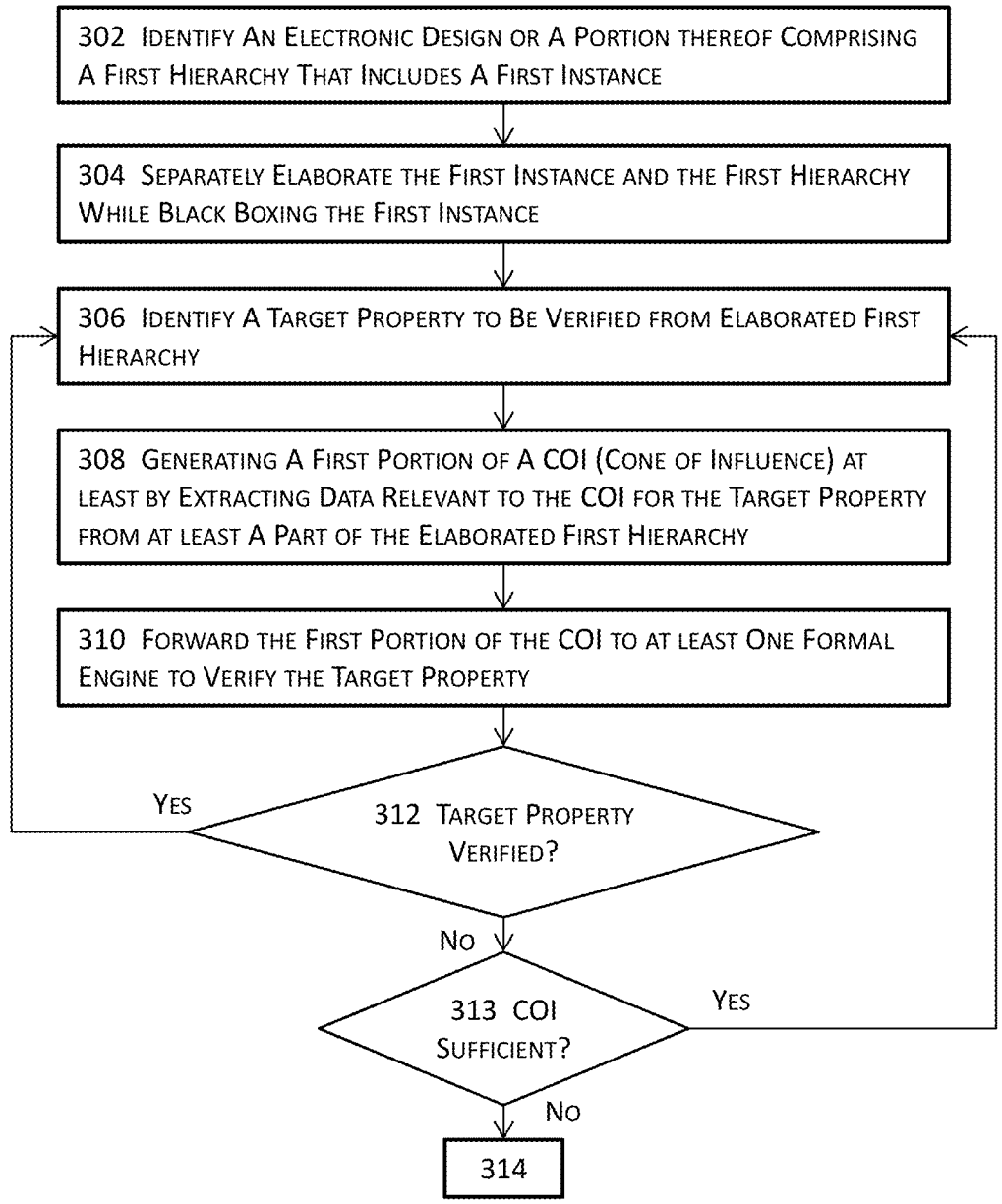
FIGS. 3A-B jointly illustrate a more detailed block diagram for implementing formal verification of an electronic design in one or more embodiments.
Figure 3B:
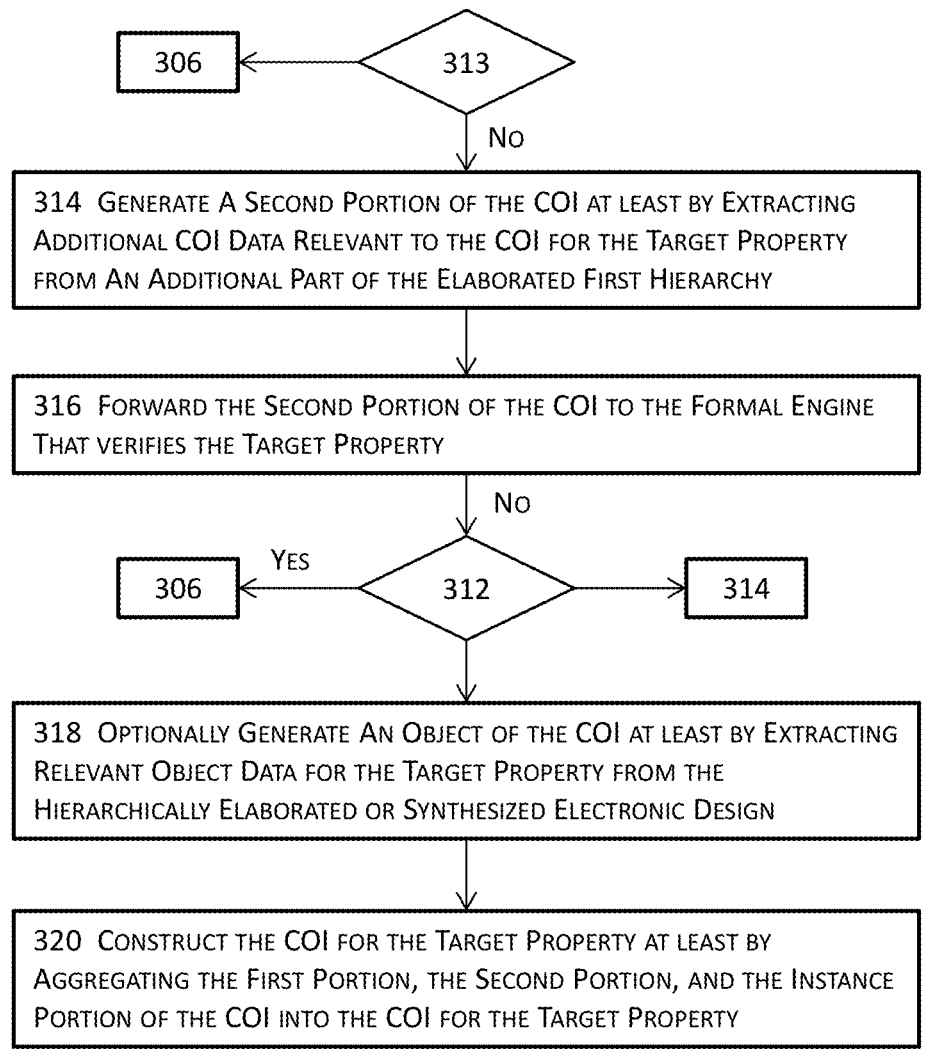

FIGS. 3A-B jointly illustrate a more detailed block diagram for implementing formal verification of an electronic design in one or more embodiments. In these one or more embodiments, an electronic design or a portion thereof may be identified at 302. The electronic design or the portion thereof may comprise a first hierarchy that further includes a first instance. The first hierarchy may also include, for example, one or more discrete circuit component designs and one or more nets or net segments that interconnect the first instance and the one or more discrete circuit component designs.

Figure 4A:
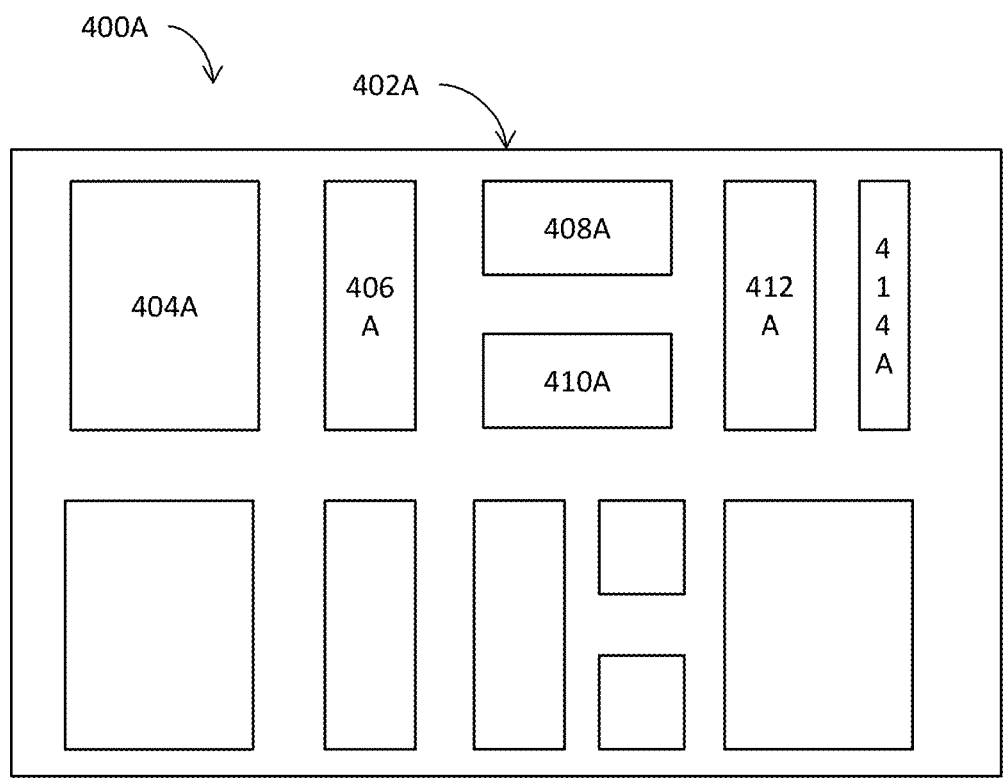
FIGS. 4A-C jointly illustrate some examples of hierarchically synthesizing an electronic design for implementing formal verification of an example of an electronic design in one or more embodiments.

In the example illustrated in FIGS. 4A-D, the electronic design or the portion 400A including a first hierarchy 402A that further includes a plurality of instances 404A, 406A, 408A, 410A, 412A, and 414A as well as the other instances illustrated in FIG. 4A may be identified at 302. In some embodiments, COI sub-files may be generated by extracting relevant data from all pertinent, elaborated or synthesized portions of the electronic design or until the entire cone of influence for a target property is constructed (e.g., when the cone of influence for the target property reaches a primary input of the electronic design or the portion identified at 302).

The first instance and the first hierarchy may be separately elaborated at 304 while black-boxing their respective child hierarchies or child instances. In the aforementioned example, the first instance may be black-boxed in the elaboration or synthesis of the first hierarchy so that only the one or more discrete circuit component designs and the one or more nets or net segments are elaborated in the synthesis or elaboration of the first hierarchy. In the example illustrated in FIG. 4B where 402B represents a target property to be verified, the first hierarchy 402A is hierarchically elaborated or synthesized while all the child instances in the first hierarchy are black-boxed when the first hierarchy is elaborated or synthesized. As a result of black-boxing these child instances in the first hierarchy, these child instances are represented in a cross-hatch pattern in FIG. 4B.

Data or information relevant to the target property (402B) may be extracted from the synthesized and elaborated first hierarchy to generate multiple COI sub-files including 406B, 408B, 410B, and 412B. Each of the COI sub-files may be extracted from its corresponding region between instance boundaries. For example, COI sub-file 406B may be extracted from the synthesized or elaborated portion of the first hierarchy between the left boundary of instance 414A and the right boundary of instance 412A. Similarly, COI sub-file 408B may be extracted from the synthesized or elaborated portion of the first hierarchy between the left boundary of instance 412A and the right boundary of instance 408A.

Each of these child instances (e.g., 404A, 406A, 408A, 410A, 412A, and 414A) may also be hierarchically extracted in a substantially similar manner for the first hierarchy 402A. For example, a computing node may hierarchically synthesize or elaborate instance 404A while black-boxing all the child instances in instance 404A in some embodiments. This approach may be applied to an instance that may be overly complex in its hierarchical structure or contents thereof and may thus slacken or even stall the computing node responsible for synthesizing or elaborating the instance all at once. In some other embodiments, an instance may be elaborated or synthesized in its entirety regardless of the levels hierarchies in the instance. This approach may be applied to instances that are not overly complex and may not impose disproportional load on the computing node responsible for synthesizing or elaborating the instance all at once. In the example illustrated in FIG. 4C, COI sub-files 402C, 404C, 406C, 408C, and 410C are generated by extracting the relevant data from the synthesized or elaborated child instances 414A, 412A, 408A, 406A, and 404A, respectively. The hierarchical synthesis or elaboration of these child instances may be performed sequentially on a single computing node in some embodiments or on a plurality of computing nodes in a parallel computing or distributed computing paradigm in some other embodiments.

With the first hierarchy and its child instances hierarchically synthesized and the corresponding COI sub-files generated accordingly, a partial or a complete cone of influence for the target property 402B may be generated by enclosing the circuit component designs, nets, or net segments represented by the relevant data in the COI sub-files with a plurality of boundary segments as illustrated by 404B. Reference numeral 404B graphically represents an example of the boundary of a complete cone of influence for the target property 402B and may be determined by using the corresponding COI sub-files extracted from the synthesis or elaboration of the first hierarchy and the child instances. More details about creating a partial or complete cone of influence of a target property are described below with reference to FIG. 4D.

A target property to be verified may be identified at 306 from the elaborated first hierarchy. A target property may include the value of a signal at a node at a specific clock cycle or in response to a particular even in the elaborated first hierarchy in some embodiments. For example, a target property may include the behavior of a signal at a primary output port of an electronic design. In the example illustrated in FIG. 4B, a target property 402B may be identified at an output node of the electronic design 400A.

In some embodiments, a target property includes an assertion. During verification of this target property, the target property may be verified when the target property is globally true. For example, a target property is globally true when the target property holds true for all possible or observed states in the electronic design of interest. On the other hand, if the target property is not found globally true, one or more counter examples may be generated for this assertion in these embodiments.

In some other embodiments, a target property may include a cover or a cover property (hereinafter a cover for singular). During verification of this target property, the cover is deemed satisfied so long as the cover occurs at least once in the electronic design. This is in contrast with the embodiments where the target property includes an assertion that is deemed verified when the target property is found globally true in the electronic design.

COI data that are relevant to the target property may be extracted from at least a part of the elaborated or synthesized first hierarchy; and a first portion of a cone of influence may be generated at 308 for the target property with the extracted COI data for at least a part of the elaborated or synthesized first hierarchy. In some embodiments, one or more structural analyses may be performed to determine the circuit component designs that may affect a target property from the elaborated or synthesized first hierarchy.

For example, the electronic design may be traversed backward from the node associated with the target property to identify circuit component designs and nets or net segments that belong to the fanin cone of the target property. These circuit component designs or their respective structural characteristics may be analyzed to determine whether they may affect the target property. If the determination result is affirmative for a circuit component design or a structural characteristic thereof the circuit component design may be extracted into the corresponding COI sub-file.

Design data including the logic elements (and any other circuit component designs that may influence the target property), one or more nets or net segments interconnecting the logic elements, and any other pertinent data required or desired for verifying the target property may be identified from the structural analysis results as the COI data. This COI data may also be used to delineate the boundary of the first portion of the cone of influence for the target property. This COI data may also be stored as a first COI sub-file for the part of the elaborated electronic design.

In some embodiments, the first portion of the COI may correspond to a portion in the elaborated first hierarchy that is closest to the target property. For example, the COI sub-file 402C for instance 414A may also be extracted because instance 414A represents the region closest to the target property. In fact, this COI sub-file 402C includes the target property 402B to be verified in this example illustrated in FIGS. 4A-D. For the non-black-boxed portion of the first hierarchy, the COI sub-file 406B may be extracted before the other COI sub-files for the non-black-boxed regions in the first hierarchy are extracted because this region corresponding to this COI sub-file 406B is closest to the target property among the non-black-boxed regions in the first hierarchy.

In some embodiments, hierarchical extraction of COI sub-files may be performed in an incremental manner that stops at an instance boundary for each extraction. For example, the first hierarchical extraction may be performed for the region including or closest to the target property and stops at the first instance boundary encountered by the extraction module. In the example illustrated in FIGS.

4A-D, the first extraction may be performed for instance 414A to create COI sub-file 402C.

In some other embodiments, all the COI sub-files may be provided to the formal engine that uses these COI sub-files to verify the target property. In these embodiments, these COI sub-files may be aggregated into a single COI file that is provided to the formal engine as an input to verify the target property.

In some embodiments, the first portion of the COI or the corresponding first COI sub-file (e.g., 402C or 402C together with 406B) may then be forwarded to at least one formal engine; and the at least one formal engine may use the first portion of the COI or the first COI sub-file to verify the target property at 310.

As described above with reference to reference numeral 308, hierarchical extraction of COI sub-files may be performed incrementally in some embodiments or all at once in some other embodiments for a target property. In the former embodiments where hierarchical extraction is performed incrementally, one or more COI sub-files (e.g., 402C) that correspond to one or more regions closest to the target property may then be forwarded to the at least one formal engine that attempts to verify the target property using only this COI sub-file. In the latter embodiments, all the COI sub-files for the target property may be provided to the at least one formal engine to verify the target property.

A determination may be made at 312 to determine whether the target property is verified (e.g., proven or unreachable). If it is determined at 312 that the target property is already verified (e.g., proven or unreachable) with the first portion of the COI or the first COI sub-file, the process may return to 306 to identify the next target property to be verified and repeat the aforementioned acts to verify the next target property. For example, COI sub-file 402C may be first provided to the at least one formal engine that attempts to verify the target property with only the COI sub-file 402C. If the target property is verified (e.g., proven or found unreachable) with only this COI sub-file 402C no further COI sub-files are needed, and the process may return to 306 to select the next target property to be verified.

On the other hand, if it is determined that the target property is not verified (e.g., one or more counter examples are found for the target property) or when the target property is reachable (e.g., the target property occur at least once in the hierarchical electronic design), a further determination may be made at 313 to determine whether the first portion of the cone of influence or the first COI sub-file is insufficient to verify the target property. In these embodiments, the one or more counter examples generated for the target property (e.g., an assertion) are deemed invalid.

If it is determined that the first portion of the cone of influence or the first COI sub-file is sufficient to verify the target property at 313, the process may also return to 306 to identify the next target property for verification. On the other hand, if the determination indicates that the first portion of the cone of influence or the first COI sub-file is insufficient to verify the target property at 313, the process may proceed to 314 to generate a second portion of the cone of influence at least by extracting additional COI data that are pertinent to the cone of influence for the target property from an additional part of the elaborated or synthesized first hierarchy. For example, if a formal engine does not verify the target property with the COI sub-file 402C extracted from the synthesized or elaborated instance 414A, the COI sub-file 406B extracted from the synthesized or elaborated first hierarchy may be determined to further aid the formal engine. Similar to the first portion of the COI, the additional COI data extracted from the additional part of the elaborated or synthesized first hierarchy for the second portion of the COI may also be stored as a second COI sub-file in some embodiments.

The second portion of the COI may be forwarded to the at least one formal engine at 316 to verify the target property. In some embodiments, the second COI sub-file may be aggregated or merged with the first COI sub-file into a partially aggregated COI file; and the partially aggregated COI file may be forwarded to the at least one formal engine that verifies the target property. In some other embodiments, the second COI sub-file may be separately forwarded to the at least one formal engine, which has already received the first COI sub-file, so that the at least one formal engine may perform verification tasks to verify the target property with the first and the second COI sub-files. The at least one formal engine may then attempt to verify the target property with the aggregated COI file or the first and the second COI sub-files.

In the aforementioned example described immediately above, if the at least one formal engine determines that the target property cannot be verified with only the COI sub-file 402C, the COI sub-file (e.g., 406B) to the next instance boundary (e.g., the right boundary of instance 412A) may be further determined and provided to the at least one formal engine. The at least one formal engine may attempt to verify the target property with both COI sub-files 402C and 406B.

If the target property is verified (e.g., proven or unreachable) the process may again return to 306 to select the next target property to be verified. When the next target property is identified for verification, various portions of the electronic design that have been elaborated or synthesized for the first target property need not be elaborated or synthesized again. Rather, the COI sub-files corresponding to this next target property may be extracted from the synthesis or elaboration results generated when the electronic design was hierarchically synthesized or elaborated for the verification of the first target property.

If the at least one formal engine cannot verify the target property with the provided COI sub-file, another COI sub-file (e.g., the COI sub-file 404C extracted from the region to the left boundary of instance 412A) may be determined and provided to the at least one formal engine, and the process may incrementally aggregate and forward these COI sub-files either as individual files or as an aggregated file to the at least one formal engine until the target property is verified, or at least one counter example is found in some embodiments.

In some other embodiments, all the COI sub-files for the target property may be aggregated into a single COI file that may be further forwarded to the at least one formal engine so that the at least one formal engine may use the completely aggregated COI file to verify the target property. For example, all COI sub-files 402C, 406B, 404C, 408B, 406C, 410B, 408C, 412B, and 410C may be aggregated into a single COI file for verification of the target property at the at least one formal engine in these embodiments.

The process may return to 312 to determine whether the target property is verified or a counter example is found with this additional second COI sub-file. If it is determined at 312 that the target property is verified with the first and second portions of the COI or the first and second COI sub-files, the process may return to 306 to identify the next target property to be verified and repeat the aforementioned acts to verify the next target property.

On the other hand, if it is determined that one or more counter examples are found even with the first and second COI sub-files or the first and second portions of the COI or the first and second COI sub-file are insufficient to verify the target property at 312, the process may return to 314 to determine or identify one or more additional COI sub-files or to generate one or more additional portions of the COI and repeat the acts of 314 and 316 for the at least one formal engine. This process may be repeated until the target property is verified in some embodiments.

A data object for the cone of influence may be optionally generated or constructed at 318 for the target property at least by using at least the relevant object data for the target property from the elaborated or synthesized portions of the electronic design or the portion thereof. For example, the COI object may be generated by using the COI sub-files generated from the hierarchical elaboration or synthesis of various hierarchies or instances of the electronic design.

The COI object may be generated in such a way to graphically encompass the circuit component designs either precisely or approximately and may be overlaid in a design window showing the electronic design or the portion thereof. For example, the COI object may be constructed to include the boundary obtained by traversing the boundaries of the circuit component designs, nets or net segments, etc. in some embodiments. In some other embodiments, the COI object may be constructed to include the boundary obtained by offsetting the boundary segments of the circuit component designs, nets or net segments, etc. or by encompassing the circuit component designs, nets or net segments, etc. from the COI sub-files with an approximate or even arbitrary boundary. In the example illustrated in FIG. 4B, the dashed boundary 404B represents an example of the COI object for the target property 402B.

The cone of influence for the target property may be constructed at 320 at least by aggregating the first portion and the second portion of the COI as well as the instance portion(s) of the COI in some embodiments. In some other embodiments, the cone of influence for the target property may be constructed at 320 by aggregating the COI sub-files for the first hierarchy of the electronic design as well as the COI sub-files for the one or more child instances belonging to the first hierarchy.

Figure 4B:
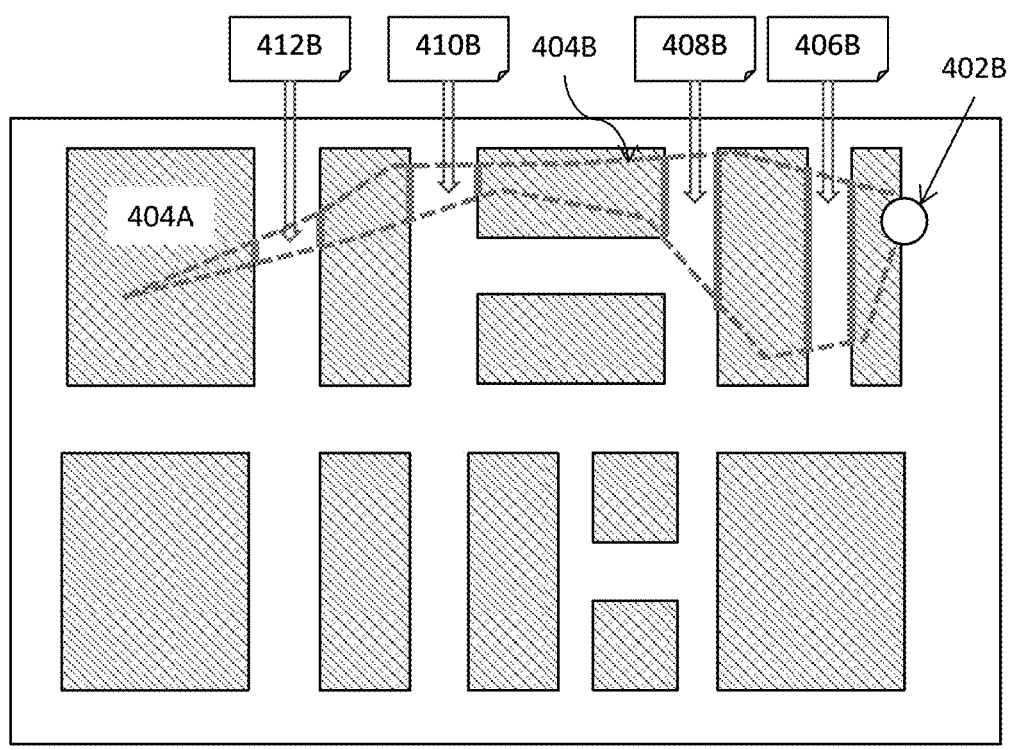
Figure 4C:
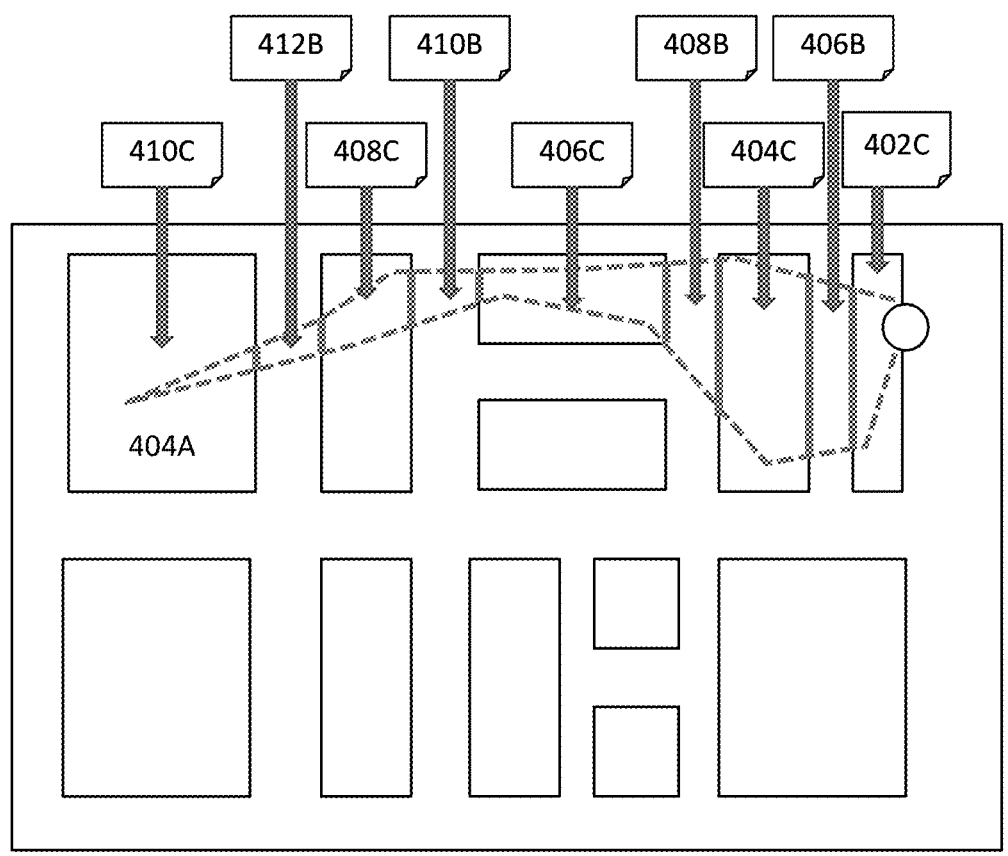
Figure 4D:
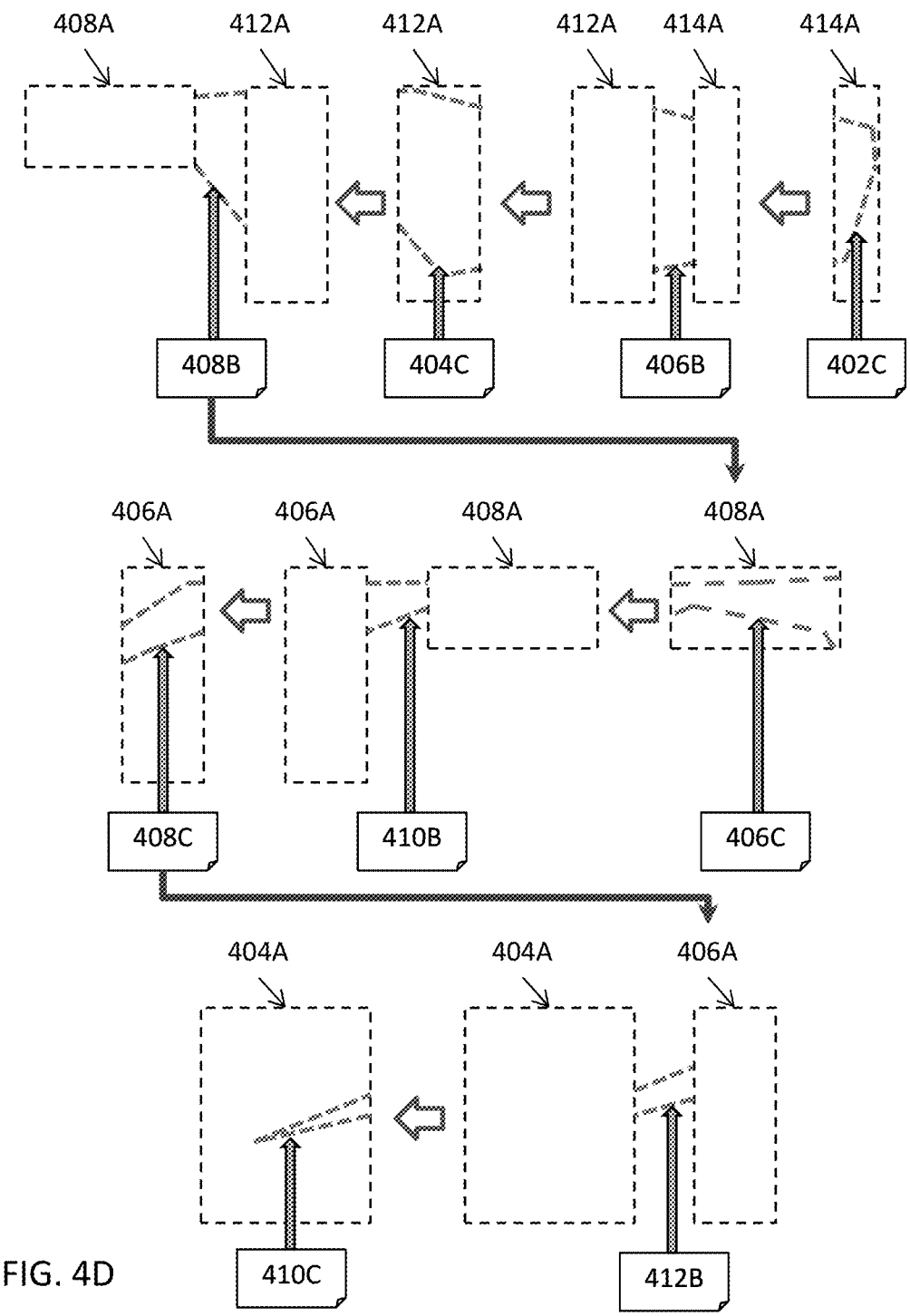
FIG. 4D illustrates an example of constructing a cone of influence (COI) for the example of an electronic design illustrated in FIGS. 4A-C in one or more embodiments.

FIG. 4D illustrates an example of determining portions of the cone of influence of a target property through hierarchical synthesis and aggregating multiple COI sub-files for the target property 402B in FIG. 4B into a partially or completely aggregated COI file, depending upon whether or not all the COI sub-files are processed. For the target property 402B in FIG. 4B, the electronic design may be hierarchically elaborated as described above. The elaboration or synthesis result for the instance or region closest or including the target property may be first identified and extracted to create the CO sub-file. In this example, instance 414A includes the target property 402B and may thus be identified and hierarchically elaborated or synthesized. The elaboration or synthesis results for instance 414A may be extracted to create the COI sub-file 402C for the target property 402B. A portion of the cone of influence for the target property 402B may then be created from the COI sub-file 402C.

As described above, this COI sub-file 402C generated from the region or instance including or closest to the target property may be forwarded to the at least one formal engine that uses the data in the COI sub-file to attempt to verify the target property. If the target property is verified with this COI sub-file the next target property may be identified for verification.

If the at least one formal engine cannot verify the target property with the data from this COI sub-file, another COI sub-file extracted from the region extending beyond instance 414A to the next instance boundary may be determined anew or identified from existing COI sub-files. In this example, if the at least one formal engine cannot verify the target property 402B with only the COI sub-file 402C, COI sub-file 406B may be determined or identified from the region that extends from the left boundary of instance 414A to the next instance boundary—the right boundary of instance 412A. This additional COI sub-file 406B may be further forwarded to the at least one formal engine that now uses both COI sub-files 402C and 406B and attempts to verify the target property 402B.

If the target property 402B is verified with the COI sub-files 402C and 406B the next target property may be identified for verification. Otherwise, another COI sub-file extracted from the region extending to the next instance boundary may be determined anew or identified from existing COI sub-files. In this example, if the at least one formal engine cannot verify the target property 402B with the COI sub-files 402C and 406B, COI sub-file 404C may be determined or identified from the region that extends to the next instance boundary—the left boundary of instance 412A. This additional COI sub-file 404C may be further forwarded to the at least one formal engine that now uses COI sub-files 402C, 406B, and 404C and attempts to verify the target property 402B. The process may continue to determine the remaining COI sub-files (408B, 406C, 410B, 408C, 412B, and 410C) by extracting relevant data from the hierarchically synthesized or elaborated instances or regions; and each of the COI sub-files may be further used to determine its corresponding portion of the cone of influence for the target property 402B. As a plurality of COI sub-files may be aggregated into a single partially or completely aggregated COI file, a plurality of portions of the cone of influence may also be merged to form a partially or completely merged cone of influence for the target property.

In addition to delineating how a COI sub-file may be determined from a synthesized region and how a cone of influence may be incrementally constructed, the aforementioned example also demonstrates that the at least one formal engine may receive and use one or more COI sub-files at a time to verify a target property, and that these one or more COI sub-files may be forwarded individually to the at least one formal engine or may be aggregated first into a partially or completely aggregated COI file that may be further forwarded to the formal engine.

It shall be noted that in the aforementioned description of FIG. 4D, the COI sub-files are forwarded to the at least one formal engine in a sequential manner starting from the COI sub-file extracted from the region or instance closest to or containing the target property, these COI sub-files need not be forwarded to the at least one formal engine on an individual basis. For example, it may be determined to first forward a number of COI sub-files including the COI sub-file extracted from the region or instance closest to or containing the target property to the at least one formal engine that attempts to verify the target property with the number of COI sub-files. The number or even the order of forwarding COI sub-files may be determined based in part or in whole upon one or more criteria. For example, the number may be determined based on heuristics, historical data or patterns of similar electronic designs, etc. In some embodiments, all the COI sub-files for a target property may be forwarded either individually or as a single aggregated COI file to the at least one formal engine to verify the target property. In these embodiments, the cone of influence for the target property 402B may be created as shown in 404B in FIG. 4B with all the COI sub-files.

Figure 5A:
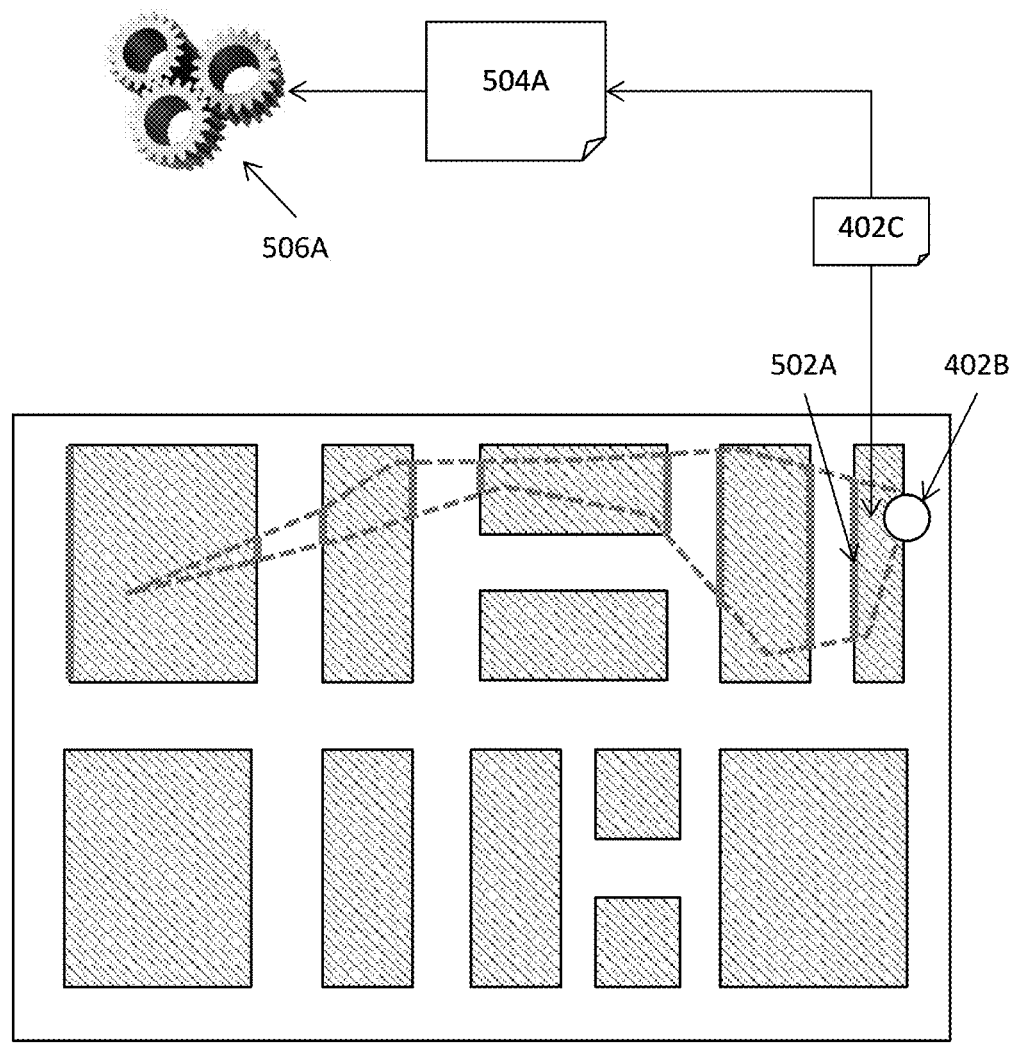
FIGS. 5A-C jointly illustrate an example of a process for implementing formal verification of an electronic design in one or more embodiments.
Figure 5B:
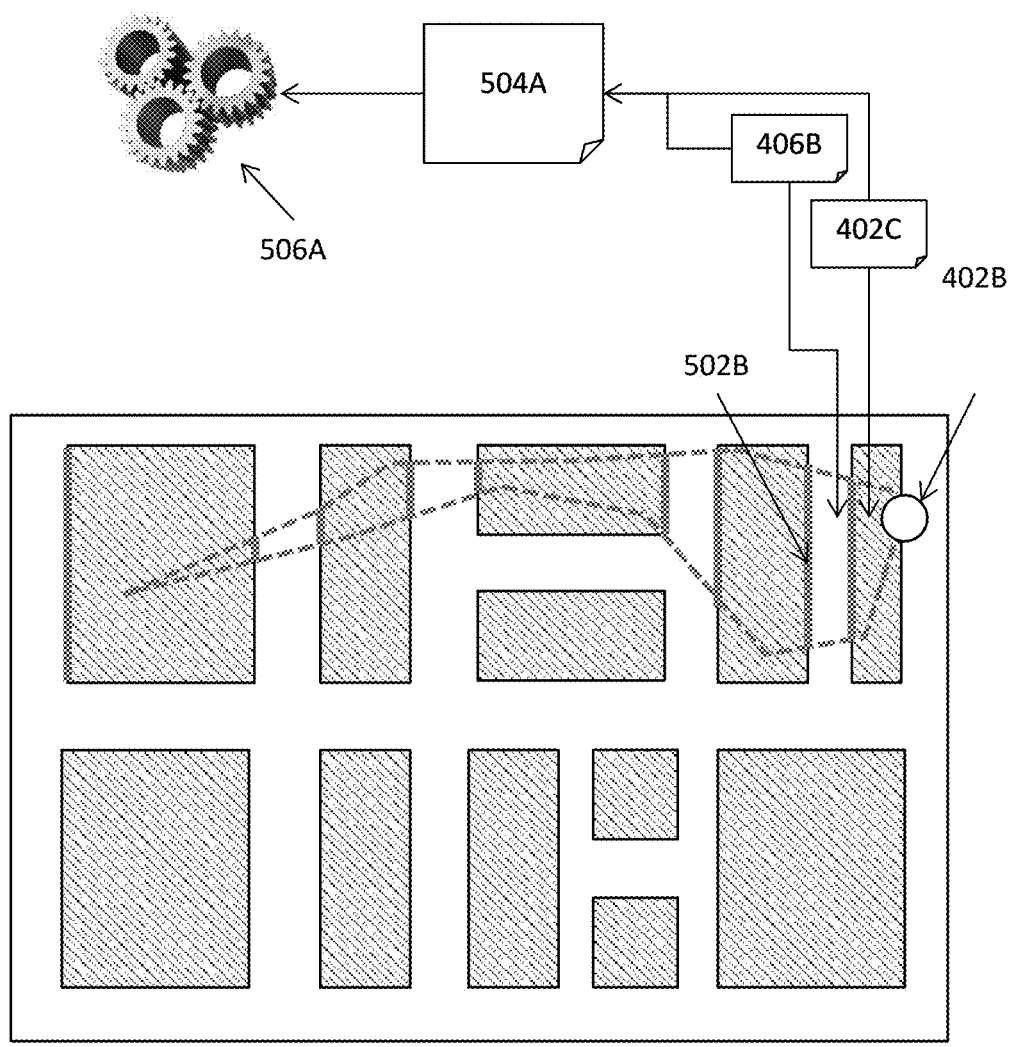
Figure 5C:
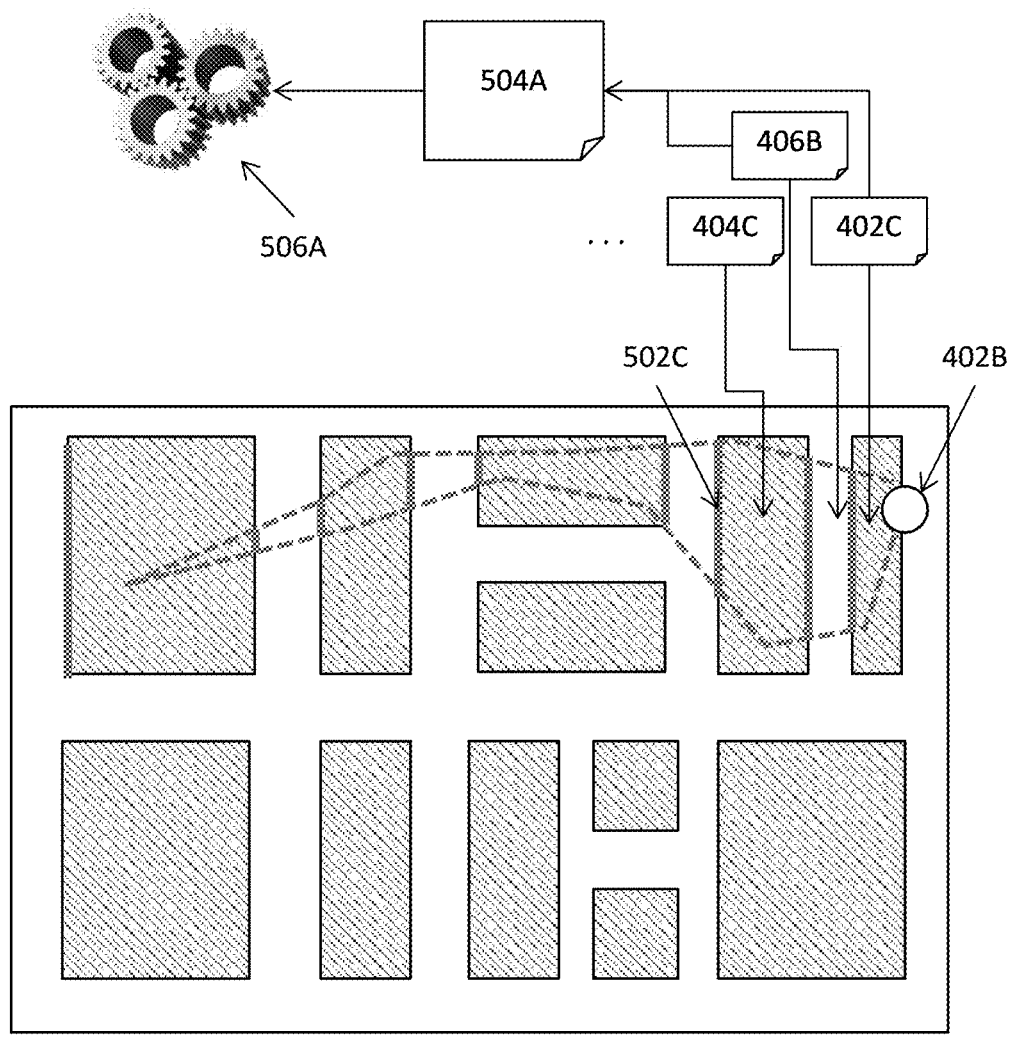

FIGS. 5A-C jointly illustrate an example of a process for implementing formal verification of an electronic design in one or more embodiments. More specifically, FIGS. 5A-C illustrate incrementally forwarding COI sub-files to the at least one formal engine that verifies the target property. The electronic design illustrated in FIGS. 5A-C carry the same reference numerals for various portions of the electronic design. For the target property 402B to be verified, the elaborated or synthesized portion of the electronic design containing or closest to the target property 402B may be first identified to extract the corresponding COI sub-file. In some embodiments, the elaborated or synthesized portion may be identified up to an instance boundary. In this example, the elaborated or synthesized portion may be identified up to the immediately next boundary 502A of instance 414A that contains the target property 402B.

The COI sub-file 402C may be extracted from the elaborated or synthesized portion. In some embodiments, this COI sub-file 402C may be forwarded to the at least one formal engine 506A that attempts to verify the target property 402B. This COI sub-file 402C may be forwarded individually to the at least one formal engine 506A or may be aggregated first into a single COI file 504A that may then be forwarded to the at least one formal engine 506A. In this example illustrated in FIG. 5A where only the COI sub-file 402C is identified from the elaborated or synthesized instance 414A, no aggregation is necessary because there is only one COI sub-file (402C) available. The at least one formal engine 506A may then attempt to verify the target property 402B using only the data from the COI sub-file 402C. If the target property is verified with only the data from COI sub-file 402C, a next target property may be selected. Otherwise, one or more next COI sub-files may be further identified.

In the example illustrated in FIG. 5B, the next COI sub-file may be identified or extracted from the elaborated or synthesized portion extending from the previous instance boundary 502A to the next instance boundary. In some embodiments, an additional elaborated or synthesized portion is identified up to the immediately next instance boundary 502B, although this additional elaborated or synthesized portion needs not necessarily stop at the immediately next instance boundary in some other embodiments. The COI sub-file 406B may be identified or extracted from this additional elaborated or synthesized portion. This COI sub-file 406B may be forwarded individually to the at least one formal engine 506A or may be first aggregated with COI sub-file 402C into the single COI file 504A before the single COI file 504A is forwarded to the at least one formal engine 506A. Similarly, the at least one formal engine may attempt to verify the target property 402B with the data from both COI sub-files 402C and 406B. If the target property 402B is verified a next target property may be identified for verification. Otherwise, the process may proceed to identify or extract one or more other COI sub-files from one or more additional elaborated or synthesized portions.

FIG. 5C illustrates the scenario where the at least one formal engine 506A does not verify the target property 402B with the data from COI sub-files 402C and 406B and thus requires additional data from at least one additional COI file. In this example, an additional elaborated or synthesized portion may be identified from the instance boundary 502B up to the immediately next instance boundary 502C. That is, the elaborated or synthesized instance 412A may be identified, and the COI sub-file 404C may be identified or extracted from this elaborated or synthesized instance 412A.

This COI sub-file 404C may be forwarded individually to the at least one formal engine 506A or may be first aggregated with COI sub-files 402C and 406B into the single COI file 504A before the single COI file 504A is forwarded to the at least one formal engine 506A. Similarly, the at least one formal engine may attempt to verify the target property 402B with the data from COI sub-files 402C, 406B, and 404C. If the target property 402B is verified a next target property may be identified for verification. Otherwise, the process may proceed to identify or extract one or more other COI sub-files from one or more additional elaborated or synthesized portions. In some embodiments illustrated in FIGS. 5A-C, COI sub-files for a target property are forwarded or aggregated incrementally (although not necessarily on a one-by-one basis) for the verification of the target property.

Figure 5D:
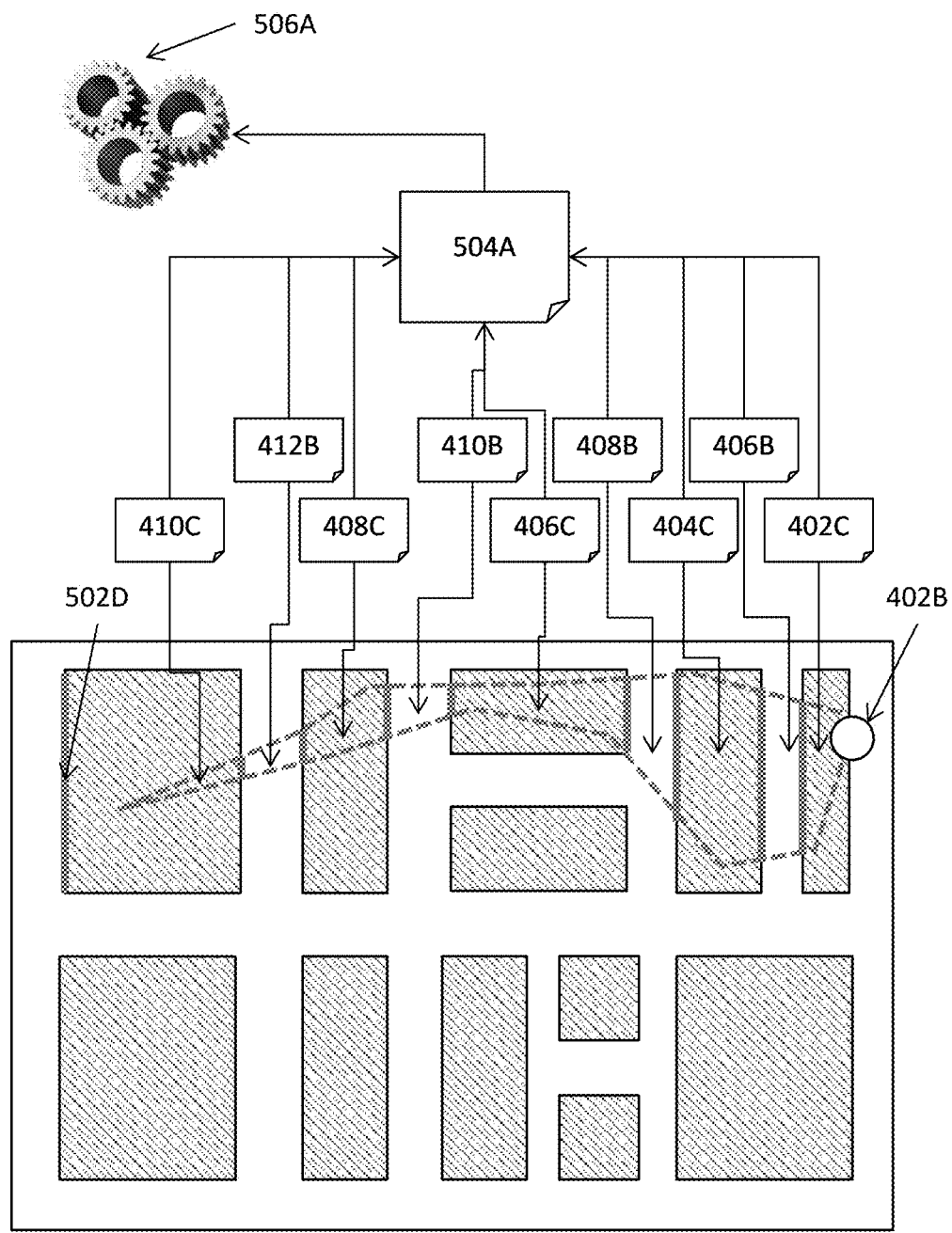
FIG. 5D illustrates another example of a process for implementing formal verification of an electronic design in one or more embodiments.

In some other embodiments, multiple COI sub-files or even all COI sub-files of a target property may be forwarded or aggregated to the at least one formal engine at once for the verification of the target property. This is illustrated in FIG. 5D where all the COI sub-files for the target property 402B are identified or extracted from the portion containing or closest to the target property to the instance boundary 502D where the primary input is located. All these COI sub-files are aggregated into the single COI file 504A before this single COI file 504A is subsequently forwarded to the at least one formal engine 506A that verifies the target property 402B.

Once an electronic design of interest passes the formal verification, the electronic design may be further implemented (e.g., a floorplanner, a global routing engine, and/or a detail routing engine, a layout editor, a design rule checker, a verification engine, etc.), post-route verification and optimization tools, and signoff tools to ensure that the electronic design is ready for manufacturing.

System Architecture Overview

Figure 6:
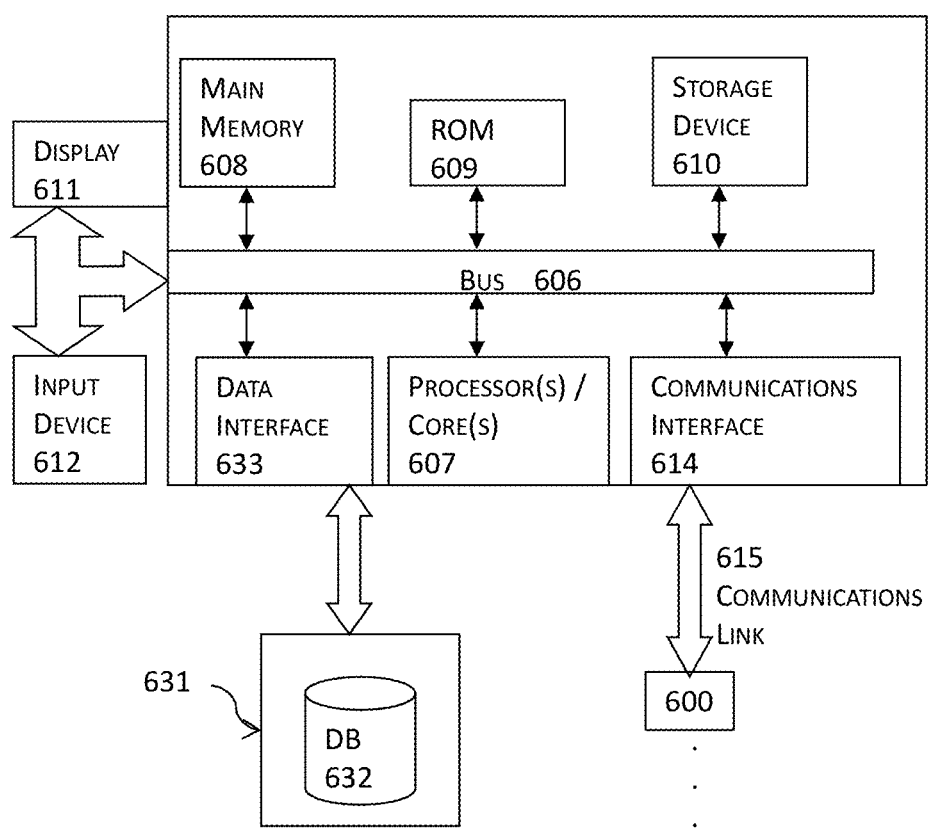
FIG. 6 illustrates a computerized system on which a method for implementing formal verification of an electronic design may be implemented.

FIG. 6 illustrates a block diagram of an illustrative computing system 600 suitable for implementing formal verification of an electronic design as described in the preceding paragraphs with reference to various figures. Computer system 600 includes a bus 606 or other communication module for communicating information, which interconnects subsystems and devices, such as processor 607, system memory 608 (e.g., RAM), static storage device 609 (e.g., ROM), disk drive 610 (e.g., magnetic or optical), communication interface 614 (e.g., modem or Ethernet card), display 611 (e.g., CRT or LCD), input device 612 (e.g., keyboard), and cursor control (not shown).

According to one embodiment, computing system 600 performs specific operations by one or more processor or processor cores 607 executing one or more sequences of one or more instructions contained in system memory 608. Such instructions may be read into system memory 608 from another computer readable/usable storage medium, such as static storage device 609 or disk drive 610. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Various actions or processes as described in the preceding paragraphs may be performed by using one or more processors, one or more processor cores, or combination thereof 607, where the one or more processors, one or more processor cores, or combination thereof executes one or more threads. For example, various acts of determination, synthesis, elaboration, extraction, COI construction, analysis, formal verification, etc. may be performed by one or more modules (e.g., one or more modules described in FIG. 1) including or functioning in tandem with one or more processors, one or more processor cores, or combination thereof.

A module described herein may also be implemented as a pure hardware module (e.g., a block of electronic circuit components, electrical circuitry, etc.) or a combination of a hardware module and a software block that jointly perform various tasks to achieve various functions or purposes described herein or equivalents thereof. For example, a module described herein may be implemented as an application-specific integrated circuit (ASIC) in some embodiments.

In these embodiments, a module may be stored at least partially in memory and may also include or function in tandem with, for example, a microprocessor or a processor core and other supportive electrical circuitry to perform specific functions which may be coded as software or hard coded as a part of an application-specific integrated circuit, ROM (read only memory), PROM (programmable read only memory), EPROM (erasable programmable read only memory), etc. despite the fact that these microprocessor, processor core, and electrical circuitry may nevertheless be shared among a plurality of module. A module described herein or an equivalent thereof may perform its respective functions alone or in conjunction with one or more other modules. A module described herein or an equivalent thereof may thus invoke one or more other modules by, for example, issuing one or more commands or function calls. The invocation of one or more other modules may be fully automated or may involve one or more user inputs. To the extent that a module includes a piece of software, the software is stored in a non-transitory computer accessible storage medium such as computer memory.

The term "computer readable storage medium" or "computer usable storage medium" as used herein refers to any non-transitory computer accessible storage medium that participates in providing instructions to processor 607 for execution. Such a medium may take many forms, including but not limited to, non-volatile media and volatile media. Non-volatile media includes, for example, optical or magnetic disks, such as disk drive 610. Volatile media includes dynamic memory, such as system memory 608. Common forms of computer readable storage media includes, for example, electromechanical disk drives (such as a floppy disk, a flexible disk, or a hard disk), a flash-based, RAM-based (such as SRAM, DRAM, SDRAM, DDR, MRAM, etc.), or any other solid-state drives (SSD), magnetic tape, any other magnetic or magneto-optical medium, CD-ROM, any other optical medium, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 600. According to other embodiments of the invention, two or more computer systems 600 coupled by communication link 615 (e.g., LAN, PTSN, or wireless network) may perform the sequence of instructions required to practice the invention in coordination with one another.

Computer system 600 may transmit and receive messages, data, and instructions, including program, i.e., application code, through communication link 615 and communication interface 614. Received program code may be executed by processor 607 as it is received, and/or stored in disk drive 610, or other non-volatile storage for later execution. In an embodiment, the computing system 600 operates in conjunction with a data storage system 631, e.g., a data storage system 631 that includes a database 632 that is readily accessible by the computing system 600. The computing system 600 communicates with the data storage system 631 through a data interface 633. A data interface 633, which is coupled with the bus 606, transmits and receives electrical, electromagnetic or optical signals that include data streams representing various types of signal information, e.g., instructions, messages and data. In embodiments of the invention, the functions of the data interface 633 may be performed by the communication interface 614.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

We claim:

1. A computer implemented method for implementing formal verification of an electronic design, comprising:
    identifying a target property for verification in a hierarchical electronic design that comprises a plurality of hierarchies;
    performing hierarchical synthesis on a hierarchy or a portion thereof in the plurality of hierarchies while black-boxing a remaining portion of the hierarchical electronic design;
    determining, at an extraction module that is stored at least partially in memory of a computing system, cone of influence (COI) data that is relevant to the target property at least by extracting the cone of influence data from a hierarchically synthesized hierarchy or portion of the hierarchy or the portion thereof; and
    forwarding at least the cone of influence data to at least one formal engine that uses the cone of influence data to verify the target property.

2. The computer implemented method of claim 1, further comprising:
    generating a COI sub-file to store the cone of influence data;
    aggregating one or more COI sub-files into a partially or completely aggregated single COI file;
    forwarding the partially or completely aggregated single COI file to the at least one formal engine that uses the partially or completely aggregated single COI file to verify the target property; and
    performing formal verification tasks for the target property using the partially or completely aggregated single COI file.

3. The computer implemented method of claim 1, the act of performing the hierarchical synthesis on the hierarchy or the portion thereof comprising:
    identifying one or more circuit component designs in the hierarchy or the portion thereof;

identifying one or more hierarchies that are situated below the hierarchy or the portion in the hierarchical electronic design; and black-boxing contents of the one or more hierarchies so that the contents of the one or more hierarchies are not elaborated in the hierarchical synthesis of the hierarchy or the portion thereof.

4. The computer implemented method of claim 3, further comprising:

performing the hierarchy synthesis on the hierarchy or the portion thereof and on the one or more hierarchies below the hierarchy at a plurality of computing nodes in a parallel or distributed computing paradigm;

extracting the COI data relevant to the target property from the hierarchically synthesized hierarchy or portion of the hierarchy or the portion thereof and from one or more corresponding hierarchically synthesized portions of the one or more hierarchies; and generating anew or identifying from an existing COI sub-file store a plurality of COI sub-files respectively storing the COI data for the hierarchically synthesized hierarchy or portion and the one or more corresponding hierarchically synthesized portions.

5. The computer implemented method of claim 4, further comprising:

aggregating two or more of the plurality of COI sub-files into a partially or completely aggregated COI file.

6. The computer implemented method of claim 1, further comprising:

determining whether the formal engine verifies the target property with the cone of influence data from the hierarchically synthesized hierarchy or portion.

7. The computer implemented method of claim 6, further comprising:

identifying a next target property for verification by the formal engine when it is determined that the formal engine verifies the target property with only the cone of influence data from the hierarchically synthesized hierarchy or portion.

8. The computer implemented method of claim 6, further comprising:

extracting anew or identifying from an existing data store the COI data relevant to the target property from one or more additional hierarchically synthesized portions of the hierarchical electronic design when it is determined that the formal engine does not verify the target property with only the cone of influence data from the hierarchically synthesized hierarchy or portion; and generating anew or identify from an existing COI sub-file store one or more additional COI sub-files respectively storing the COI data for the one or more additional hierarchically synthesized portions.

9. The computer implemented method of claim 8, further comprising:

forwarding the COI data in the one or more additional COI sub-files to the at least one formal engine; and performing formal verification tasks for the target property using the COI data in the one or more additional COI sub-files.

10. A system for implementing formal verification of an electronic design, comprising:

one or more modules, at least one of which is stored in part or in whole in memory and comprises at least one processor including one or more processor cores executing one or more threads in a computing system;

a non-transitory computer accessible storage medium storing thereupon program code that includes a sequence of instructions that, when executed by the at least one processor, causes the at least one processor at least to:

identify a target property for verification in a hierarchical electronic design that comprises a plurality of hierarchies;

perform hierarchical synthesis on a hierarchy or a portion thereof in the plurality of hierarchies while black-boxing a remaining portion of the hierarchical electronic design;

an extraction module that is stored at least partially in the non-transitory computer accessible storage medium and is configured to determine cone of influence (COI) data that is relevant to the target property at least by extracting the cone of influence data from a hierarchically synthesized hierarchy or portion of the hierarchy or the portion thereof; and forward at least the cone of influence data to a formal engine that uses the cone of influence data to verify the target property.

11. The system of claim 10, wherein the program code includes the sequence of instructions that, when executed by the at least one processor, further cause the at least one processor to:

generate a COI sub-file to store the cone of influence data;

aggregate one or more COI sub-files into a partially or completely aggregated single COI file;

forward the partially or completely aggregated single COI file to the formal engine that uses the partially or completely aggregated single COI file to verify the target property; and perform formal verification tasks for the target property using the partially or completely aggregated single COI file.

12. The system of claim 10, wherein the program code includes the sequence of instructions that, when executed by the at least one processor, further cause the at least one processor that is to perform the hierarchical synthesis on the hierarchy or the portion thereof to:

Identify one or more circuit component designs in the hierarchy or the portion thereof;

identify one or more hierarchies that are situated below the hierarchy or the portion in the hierarchical electronic design; and black-box contents of the one or more hierarchies so that the contents of the one or more hierarchies are not elaborated in the hierarchical synthesis of the hierarchy or the portion thereof.

13. The system of claim 12, wherein the program code includes the sequence of instructions that, when executed by the at least one processor, further cause the at least one processor to:

perform the hierarchy synthesis on the hierarchy or the portion thereof and on the one or more hierarchies below the hierarchy at a plurality of computing nodes in a parallel or distributed computing paradigm;

extract the COI data relevant to the target property from the hierarchically synthesized hierarchy or portion of the hierarchy or the portion thereof and from one or more corresponding hierarchically synthesized portions of the one or more hierarchies; and generate anew or identifying from existing COI sub-file store a plurality of COI sub-files respectively storing the COI data for the hierarchically synthesized hierarchy or portion and the one or more corresponding hierarchically synthesized portions.

14. The system of claim 13, wherein the program code includes the sequence of instructions that, when executed by the at least one processor, further causes the at least one processor to:
  aggregate two or more of the plurality of COI sub-files into a partially or completely aggregated COI file.

15. The system of claim 10, wherein the program code includes the sequence of instructions that, when executed by the at least one processor, further causes the at least one processor to:
  determine whether the formal engine verifies the target property with the cone of influence data from the hierarchically synthesized hierarchy or portion.

16. An article of manufacture comprising a non-transitory computer accessible storage medium having stored thereupon a sequence of instructions which, when executed by at least one processor or at least one processor core executing one or more threads, causes the at least one processor or the at least one processor core to perform a set of acts for implementing formal verification of an electronic design, the set of acts comprising:
  identifying a target property for verification in a hierarchical electronic design that comprises a plurality of hierarchies;
  performing hierarchical synthesis on a hierarchy or a portion thereof in the plurality of hierarchies while black-boxing a remaining portion of the hierarchical electronic design;
  determining, at an extraction module that is stored at least partially in memory of a computing system, cone of influence (COI) data that is relevant to the target property at least by extracting the cone of influence data from a hierarchically synthesized hierarchy or portion of the hierarchy or the portion thereof; and
  forwarding at least the cone of influence data to a formal engine that uses the cone of influence data to verify the target property.

17. The article of manufacture of claim 16, the set of acts further comprising:
  determining whether the formal engine verifies the target property with the cone of influence data from the hierarchically synthesized hierarchy or portion.

18. The article of manufacture of claim 17, the set of acts further comprising:
  identifying a next target property for verification by the formal engine when it is determined that the formal engine verifies the target property with only the cone of influence data from the hierarchically synthesized hierarchy or portion.

19. The article of manufacture of claim 17, the set of acts further comprising:
  extracting anew or identifying from existing data store the COI data relevant to the target property from one or more additional hierarchically synthesized portions of the hierarchical electronic design when it is determined that the formal engine does not verify the target property with only the cone of influence data from the hierarchically synthesized hierarchy or portion; and
  generating anew or identify from existing COI sub-file store one or more additional COI sub-files respectively storing the COI data for the one or more additional hierarchically synthesized portions.

20. The article of manufacture of claim 19, the set of acts further comprising:
  forwarding the COI data in the one or more additional COI sub-files to the formal engine; and
  performing formal verification tasks for the target property using the COI data in the one or more additional COI sub-files.

21. The article of manufacture of claim 16, the set of acts further comprising:
  generating a COI sub-file to store the cone of influence data;
  aggregating one or more COI sub-files into a partially or completely aggregated single COI file;
  forwarding the partially or completely aggregated single COI file to the formal engine that uses the partially or completely aggregated single COI file to verify the target property; and
  performing formal verification tasks for the target property using the partially or completely aggregated single COI file.

22. The article of manufacture of claim 16, the set of acts further comprising:
  identifying one or more circuit component designs in the hierarchy or the portion thereof;
  identifying one or more hierarchies that are situated below the hierarchy or the portion in the hierarchical electronic design;
  black-boxing contents of the one or more hierarchies so that the contents of the one or more hierarchies are not elaborated in the hierarchical synthesis of the hierarchy or the portion thereof;
  performing the hierarchy synthesis on the hierarchy or the portion thereof and on the one or more hierarchies below the hierarchy at a plurality of computing nodes in a parallel or distributed computing paradigm;
  extracting the COI data relevant to the target property from the hierarchically synthesized hierarchy or portion of the hierarchy or the portion thereof and from one or more corresponding hierarchically synthesized portions of the one or more hierarchies;
  generating anew or identifying from existing COI sub-file store a plurality of COI sub-files respectively storing the COI data for the hierarchically synthesized hierarchy or portion and the one or more corresponding hierarchically synthesized portions; and
  aggregating two or more of the plurality of COI sub-files into a partially or completely aggregated COI file.

* * * * *